United States Patent
Cheng et al.

(10) Patent No.: US 7,199,059 B2
(45) Date of Patent: Apr. 3, 2007

(54) METHOD FOR REMOVING POLYMER AS ETCHING RESIDUE

(75) Inventors: Yi-Fang Cheng, Jhudong Township, Hsinchu County (TW); Shan-Jen Yu, Longtan Township, Taoyuan County (TW); Cheng-Kweng Chen, Taipei (TW); Yu-Ming Huang, Fongyuan (TW)

(73) Assignee: United Microelectronics Corp., Hsinchu (TW)

( * ) Notice: Subject to any disclaimer, the term of this patent is extended or adjusted under 35 U.S.C. 154(b) by 184 days.

(21) Appl. No.: 10/904,149

(22) Filed: Oct. 26, 2004

(65) Prior Publication Data

US 2006/0089003 A1    Apr. 27, 2006

(51) Int. Cl.
*H01L 21/302* (2006.01)
*H01L 21/461* (2006.01)

(52) U.S. Cl. .................. 438/706; 438/945; 257/E21.49

(58) Field of Classification Search ................ 438/706, 438/734, 906, 945; 257/E21.036, E21.033, 257/E21.49

See application file for complete search history.

(56) References Cited

U.S. PATENT DOCUMENTS

| | | | |
|---|---|---|---|
| 5,702,869 A * | 12/1997 | Chien et al. ................. | 430/313 |
| 6,228,563 B1 * | 5/2001 | Starov et al. ................ | 430/327 |
| 6,837,611 B2 * | 1/2005 | Kuo ......................... | 366/168.2 |
| 6,951,823 B2 * | 10/2005 | Waldfried et al. ........... | 438/710 |

FOREIGN PATENT DOCUMENTS

JP     09283507 A   * 10/1997

\* cited by examiner

*Primary Examiner*—Caridad Everhart
(74) *Attorney, Agent, or Firm*—Jianq Chyun IP Office

(57) ABSTRACT

A method for removing polymer as an etching residue is described. A substrate with polymer as an etching residue thereon is provided, and a hydrogen-containing plasma is used to treat the substrate. A wet clean step is then performed to remove the polymer from the substrate. The treatment using hydrogen-containing plasma can change the chemical property of the polymer, so that the polymer can be removed more easily in the subsequent wet clean step.

19 Claims, 1 Drawing Sheet

METHOD FOR REMOVING POLYMER AS ETCHING RESIDUE

BACKGROUND OF THE INVENTION

1. Field of the Invention

The present invention relates to a semiconductor process. More particularly, the present invention relates to a method for removing polymer as an etching residue from a substrate.

2. Description of the Related Art

In a semiconductor process, the patterning process of a material layer usually includes a lithography step for forming patterned photoresist and an etching step using the patterned photoresist as a mask. Since the photoresist is an organic material, some polymer as an etching residue remains on the substrate after the etching step and will cause certain problems. For example, in a process of forming damascene openings, polymer as an etching residue is frequently formed on the sidewall of the openings. If the polymer is not removed with a suitable method, it will adversely affect the effect of metal filling, so that the quality of the resulting metal interconnection is degraded.

To solve the problem of polymer residue, wet clean is usually performed after the etching step. The wet clean step uses a solution containing a surfactant to wash the substrate and remove the polymer therefrom. However, in a damascene opening process using a metal hard-mask layer, incomplete removal of sidewall polymer is frequently found in the damascene openings in the central area of a wafer. Therefore, the quality of the metal interconnection structure filled in the damascene openings is greatly degraded to decrease the yield of product significantly.

SUMMARY OF THE INVENTION

In view of the foregoing, this invention provides a method for removing polymer as an etching residue that can remove polymer from a substrate more completely as compared with the prior art.

This invention is also intended to provide a method for removing polymer as an etching residue from damascene openings after the etching step of the same.

The method for removing polymer as an etching residue of this invention is described as follows. A substrate with polymer as an etching residue thereon is provided, and a hydrogen-containing plasma is used to treat the substrate. A wet clean step is then performed to remove the polymer from the substrate.

In the above method, the hydrogen-containing plasma treatment can be conducted in situ in the same etching chamber of the dry etching step in which the etching residue is produced, so as to save the processing time and to avoid possible damages of the substrate due to mechanical movement. In addition, the gases for producing the hydrogen-containing plasma may include nitrogen gas ($N_2$) to enhance dispersion of the polymer in the solution used for the subsequent wet clean step.

In this invention, the treatment using hydrogen-containing plasma can change the chemical property of the polymer, so that the polymer can be removed more easily in the subsequent wet clean step. Accordingly, by applying the method of this invention to a process of forming damascene openings, the polymer can be removed from the sidewalls of the damascene openings more completely to ensure the quality of the metal interconnection structure formed later.

It is to be understood that both the foregoing general description and the following detailed description are exemplary, and are intended to provide further explanation of the invention as claimed.

DESCRIPTION OF THE PREFERRED EMBODIMENTS

In the preferred embodiment of this invention, polymer removal after the etching step of a dual-damascene opening process is described as an example, which is not intended to restrict the scope of this invention.

Figure 1:
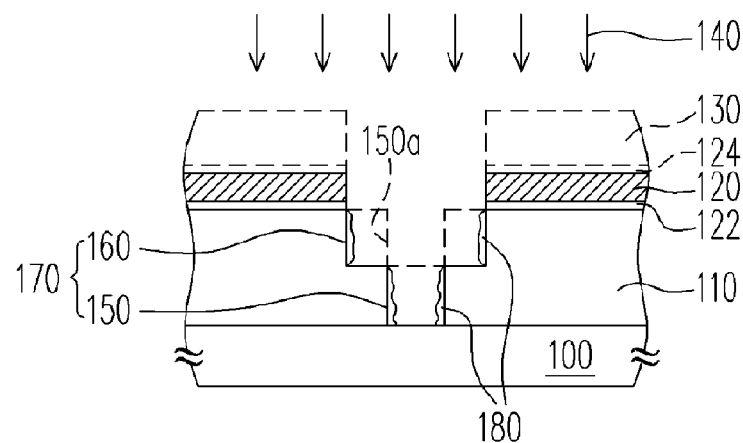
FIG. 1 illustrates an example of existing dual-damascene opening processes.

Referring to FIG. 1, FIG. 1 illustrates an example of existing dual damascene opening processes. A dielectric layer 110 is formed on a substrate 100 first, wherein the material of the dielectric layer 110 may be silicon oxide or a silicon-based low-k material like HSQ and MSQ. A hard mask layer 120, such as, a silicon nitride layer or a metallic layer, is then formed on the dielectric layer 110. When the material of the hard mask layer 120 is a metallic material like titanium nitride (TiN), intermediate layers 122 and 124 are usually formed under and above the hard mask layer 120. The intermediate layers 122 and 124 may be inorganic layers that can block diffusion of metal atoms and/or enhance the adhesion between layers.

Then, the hard mask layer 120 is defined to form a via hole pattern (not shown), and the exposed dielectric layer 110 is etched to formed a pre-via hole 150*a*. A patterned photoresist layer 130 defining a trench is formed on the hard mask layer 120, and then an anisotropic dry etching step is performed to etch the exposed dielectric 110 using the patterned photoresist layer 130 as a mask. With the etching step, the pre-via hole 150*a* is made deeper to form a via hole 150, and a trench 160 is also formed, while the photoresist layer 130 and the upper intermediate layer 124 are etched away. The via hole 150 and trench 160 together constitute a dual damascene opening 170, wherein the sidewalls of the via hole 150 and trench 160 is formed with polymer 180 as an etching residue thereon. In the above process, when the dielectric layer 110 includes a silicon-based dielectric material like silicon oxide, the etching gas is usually a fluorine-containing gas like $CHF_3$ or $CF_4$ so that the polymer 180 as an etching residue contains fluorine.

Figure 2:
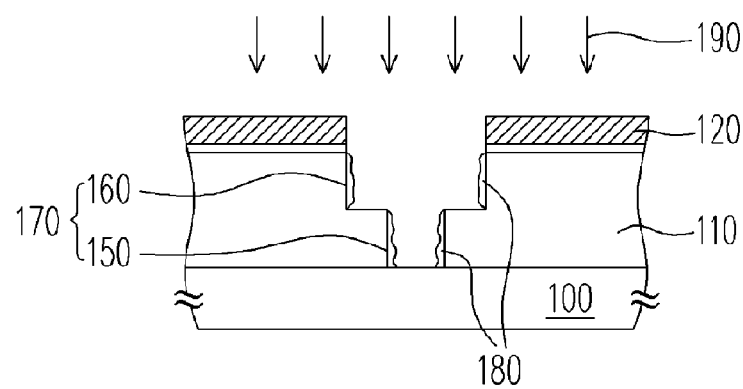
FIGS. 2–3 illustrate a process flow of removing polymer as an etching residue according to a preferred embodiment of this invention, following the steps of FIG. 1.

Referring to FIG. 2, FIG. 2 illustrates the hydrogen-containing plasma treatment of the method for removing polymer as an etching residue according to the preferred embodiment of this invention. Hydrogen-containing plasma 190 is used to treat the substrate 100 that has been subjected to the above processes, wherein the plasma-generating gas may be a mixed gas of $H_2$ and $N_2$, or a mixed gas of $H_2$ and a noble gas as a carrier gas, such as, argon (Ar) and helium (He).

When a mixed gas of $H_2$ and $N_2$ is used, the flow rate of $H_2$ is preferably 50–800 sccm, the flow rate of $N_2$ is preferably 10–500 sccm, the power is preferably 50–2000 W, and the pressure is preferably 30 mTorr to 1 Torr. When a mixed gas of $H_2$ and a noble gas as a carrier gas is used, the flow rate of $H_2$ is also preferably 50–800 sccm, the preferable ranges of the power and the pressure are the same as above, and the flow rate of the carrier gas is adjusted as required.

Figure 3:
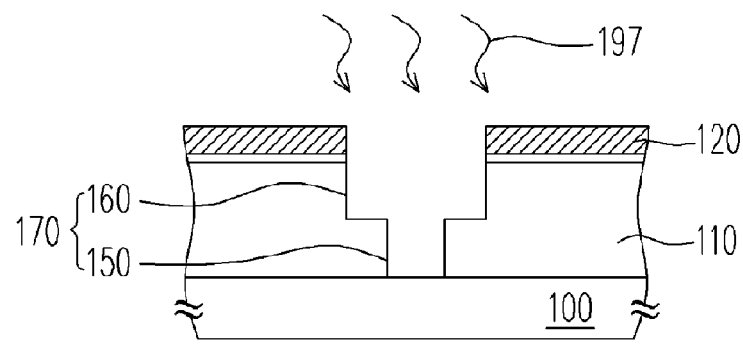

Referring to FIG. 3, a wet clean step 197 is then performed to remove the polymer 180, using an aqueous solution containing a surfactant, for example. The surfactant may be a quarternary ammonium salt.

When an etching gas containing fluorine is used in the etching step of the dual damascene opening 170, the polymer 180 also contains fluorine. Therefore, in the treatment using hydrogen-containing plasma 190, the hydrogen species implanted into the polymer 180 will combine with fluorine to form HF, which will be converted to hydrofluoric acid in the subsequent wet clean step 197 to facilitate breakdown of the polymer 180. Moreover, when the plasma generating gases include $H_2$ and $N_2$, the plasma treatment causes amino (—$NH_2$) groups to form on the polymer chains, so that the polymer 180 can be dispersed more easily into the solution in the subsequent wet clean step 197.

EXAMPLES

Several examples are provided below to demonstrate the effects of the present invention, wherein four examples are those of this invention where $N_2/H_2$ plasma is used to treat wafers, and the other four are comparative examples where no plasma treatment is applied. The conditions of each example and the corresponding number of polymer defects measured after the wet clean step are shown in Table 1.

TABLE 1

|  |  | Comparative Examples | | | | Examples of Invention | | | |
|---|---|---|---|---|---|---|---|---|---|
|  |  | 1 | 2 | 3 | 4 | 5 | 6 | 7 | 8 |
| Condition | w/o H-plasma treatment | X | X | X | X |  |  |  |  |
|  | 1000 W (top*)/500 W (bottom*) $N_2$: 100 sccm/$H_2$: 300 sccm |  |  |  |  | X | X |  |  |
|  | 1000 W (top)/500 W (bottom) $N_2$: 50 sccm/$H_2$: 350 sccm |  |  |  |  |  |  | X | X |
|  | Count of polymer defects | 1287 | 1057 | 1197 | 1981 | 66 | 28 | 53 | 14 |

*top: top HF-RF power
*bottom: bottom LF-RF power

As shown in Table 1, by treating the substrate with hydrogen-containing plasma before the wet clean step, the number of polymer defects on the substrate can be greatly decreased, which means that the polymer residue in the damascene openings is removed more completely. Therefore, the quality of the metal interconnection structure formed later can be ensured, and the yield of product can be increased.

Furthermore, though the above preferred embodiment of this invention describes only a process of forming dual damascene openings, the scope of this invention is not restricted to it. For example, this invention can be applied to the processes of forming single damascene openings, i.e., via holes or line trenches, or any other patterning process that also suffers from polymer etching residue.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for removing polymer as an etching residue, comprising:
   providing a substrate formed with a patterned metal hard-mask layer and polymer as an etching residue thereon;
   using hydrogen-containing plasma to treat the substrate; and
   performing a wet clean step to remove the polymer from the substrate.

2. The method of claim 1, wherein the hydrogen-containing plasma treatment is conducted in situ in an etching chamber of a dry etching step in which the etching residue was produced.

3. The method of claim 1, wherein gases for producing the hydrogen-containing plasma comprise $H_2$ and $N_2$.

4. The method of claim 1, wherein the polymer is formed on a sidewall of an opening in a dielectric layer formed over the substrate, the opening being defined by the patterned metal hard-mask layer.

5. The method of claim 1, wherein the polymer contains fluorine.

6. The method of claim 1, wherein the wet clean step uses an aqueous solution containing quarternaly ammonium salt to remove the polymer from the substrate.

7. The method of claim 1, wherein gases for producing the hydrogen-containing plasma comprise $H_2$ and a noble gas as a carrier gas.

8. The method of claim 7, wherein the noble gas is argon or helium.

9. The method of claim 4, wherein the opening comprises a dual damascene opening.

10. A method for removing polymer as an etching residue, comprising:
    providing a substrate formed with a patterned metal hard-mask layer and a damascene opening thereon, wherein a sidewall of the darnascene opening is formed with polymer thereon as an etching residue of a dry etching step for forming the damascene opening, and the dry etching step uses an etching gas containing fluorine;
    using hydrogen-containing plasma to treat the substrate; and
    performing a wet clean step to remove the polymer from the substrate.

11. The method of claim 10, wherein the hydrogen-containing plasma treatment is conducted in situ in an etching chamber of the dry etching step.

12. The method of claim 10, wherein the damascene opening comprises a dual damascene opening.

13. The method of claim 10, wherein the damascene opening is formed in a silicon oxide layer or a silicon-based low-k material layer.

14. The method of claim 10, wherein the wet clean step uses an aqueous solution containing quartemary ammonium salt to remove the polymer.

15. The method of claim 10, wherein gases for producing the hydrogen-containing plasma comprise $H_2$ and $N_2$.

16. The method of claim 15, wherein in the hydrogen-containing plasma treatment, $H_2$ is supplied in a flow rate of 50–800 sccm, $N_2$ is supplied in a flow rate of 10–500 sccm, and a power of 50–200 W and a pressure of 30 mTorr to 1 Torr are applied.

17. The method of claim 10, wherein gases for producing the hydrogen-containing plasma comprise $H_2$ and a noble gas as a carrier gas.

18. The method of claim 17, wherein the noble gas is argon or helium.

19. The method of claim 17, wherein in the hydrogen-containing plasma treatment, $H_2$ is supplied in a flow rate of 50–800 sccm, and a power of 50–2000 W and a pressure of 30 mTorr to 1 Torr are applied.

* * * * *